United States Patent
Han

[11] Patent Number: 6,132,081
[45] Date of Patent: Oct. 17, 2000

[54] METHOD FOR CALIBRATING OPTICAL SENSOR USED TO MEASURE THE TEMPERATURE OF A SUBSTRATE DURING RAPID THERMAL PROCESS

[75] Inventor: Jae-Won Han, Kyungki-do, Rep. of Korea

[73] Assignees: Amkor Technology, Inc., Chandler, Ariz.; Anam Semiconductor, Inc., Seoul, Rep. of Korea

[21] Appl. No.: 09/220,987

[22] Filed: Dec. 23, 1998

[30] Foreign Application Priority Data

Dec. 23, 1997 [KR] Rep. of Korea ............... 97-72470

[51] Int. Cl.[7] ............... H01L 21/00; G01K 15/00; G01J 5/08
[52] U.S. Cl. ............... 374/1; 437/200; 438/655; 374/126; 374/128; 374/178
[58] Field of Search ............... 374/1, 101, 121, 374/124, 133, 178, 2, 3, 126, 128; 438/798, 655; 437/200; 257/66; 250/492.2

[56] References Cited

U.S. PATENT DOCUMENTS

| | | | |
|---|---|---|---|
| 4,468,308 | 8/1984 | Scovell et al. | 204/192 R |
| 4,698,486 | 10/1987 | Sheets | 250/492.2 |
| 4,886,765 | 12/1989 | Chen et al. | 437/200 |
| 5,043,300 | 8/1991 | Nulman | 437/200 |
| 5,326,173 | 7/1994 | Evans et al. | 374/128 |
| 5,388,909 | 2/1995 | Johnson et al. | 374/161 |
| 5,553,939 | 9/1996 | Dilhac et al. | 374/1 |
| 5,593,923 | 1/1997 | Horiuchi et al. | 437/200 |
| 5,612,253 | 3/1997 | Farahani et al. | 437/190 |
| 5,686,359 | 11/1997 | Meester et al. | 437/200 |
| 5,707,146 | 1/1998 | Gaus et al. | 374/1 |
| 5,731,226 | 3/1998 | Lin et al. | 437/200 |
| 5,762,713 | 6/1998 | Paranjpe | 118/725 |
| 5,828,131 | 10/1998 | Cabral, Jr. et al. | 257/757 |
| 5,841,110 | 11/1998 | Nenyei et al. | 219/497 |
| 5,848,842 | 12/1998 | Peuse et al. | 374/1 |
| 5,883,003 | 3/1999 | Matsubara | 438/655 |
| 5,897,381 | 4/1999 | Aronowitz et al. | 438/798 |
| 5,937,325 | 8/1999 | Ishida | 438/655 |
| 5,938,335 | 8/1999 | Yam | 374/124 |
| 5,962,872 | 10/1999 | Zhang et al. | 257/66 |
| 5,988,874 | 11/1999 | Rohner | 374/2 |
| 6,056,433 | 5/2000 | Yam | 374/2 |

*Primary Examiner*—G. Bradley Bennett
*Assistant Examiner*—G. Verbitsky
*Attorney, Agent, or Firm*—Skjerven Morrill MacPherson LLP; James E. Parsons; Kenneth S. Korea

[57] ABSTRACT

The present invention provides a method of forming titanium silicide by subjecting a silicon substrate having titanium formed thereon to a thermal process, such as rapid thermal process. The silicon substrate and the titanium are being heated to at least a selected annealing temperature, which is the minimum temperature on and after which the titanium silicide displays generally constant sheet resistivity and resistance non-uniformity. The selected annealing temperature is determined by heating the silicon substrate and the titanium from an initial temperature to a final temperature to create titanium silicide and measuring the sheet resistance and/or resistance non-uniformity at selected temperature intervals between the initial temperature and the final temperature. The temperature on and after which the sheet resistance and resistance non-uniformity is generally constant is the selected annealing temperature. The temperature of the silicon substrate and titanium can be measured by an optical sensor such as an optical pyrometer. The selected annealing temperature can be used to calibrate the optical sensor for more accurate measurement of the temperature during the thermal process.

8 Claims, 2 Drawing Sheets

METHOD FOR CALIBRATING OPTICAL SENSOR USED TO MEASURE THE TEMPERATURE OF A SUBSTRATE DURING RAPID THERMAL PROCESS

BACKGROUND OF THE INVENTION (a) Field of the Invention

The present invention relates to a method of forming titanium silicide by heating a silicon substrate having a titanium film formed thereon. Moreover, the present invention relates to a method of measuring the temperature during the heating process.

(b) Description of the Background

Silicide is typically used to decrease contact resistance between a silicon substrate and a metal layer in semiconductor devices. More specifically, titanium silicide ($TiSi_2$) is used in integrated circuit technologies because it has low resistivity and high thermal stability. Titanium silicide is formed by depositing a layer of titanium on a silicon substrate and subjecting the silicon substrate to a rapid and high thermal treatment known as rapid thermal process (RTP) which is well known in the art. The rapidness of the RTP process prevents impurities from defusing into the substrate. RTP of titanium formed on a silicon substrate, however, may result in a titanium silicide layer having an excessively high resistance value and resistance non-uniformity. Accordingly it is desirable to perform the RTP at a temperature which causes the titanium silicide layer to have a low and generally constant resistance value and resistance non-uniformity.

An optical sensor or an optical pyrometer is used to measure the temperature of the silicon substrate including the titanium or titanium/titanium silicide. The temperature is measured by making a visual comparison of luminance of specific wave length emitted from the silicon substrate with titanium or titanium/silicide to standard values. In order to be able to accurately measure the temperature, the optical sensor must be precisely calibrated. Accordingly, it is desirable to provide a method for accurately calibrating the optical sensor.

SUMMARY OF THE INVENTION

The present invention broadly provides a method of forming titanium silicide ($TiSi_2$) by subjecting a silicon substrate having a titanium film formed thereon to a thermal treatment, such as a rapid thermal process (RTP). The thermal process heats the silicon substrate and the titanium film to at least a selected annealing temperature. The selected annealing temperature is the minimum temperature on and after which the titanium silicide displays a generally constant and unchanging sheet resistivity and resistance non-uniformity. The selected annealing temperature is preferably about 750° C.

The present invention additionally provides a method for determining the above-mentioned selected annealing temperature at or above which the thermal treatment is to be performed. The method comprises forming a titanium film on a silicon substrate; heating the silicon substrate and the titanium film from an initial temperature to a final temperature to create titanium silicide; measuring a resistivity factor of the titanium silicide at selected temperature intervals between the initial temperature and the final temperature; and determining a minimum temperature on and after which the resistivity factor is generally constant. The resistivity factor includes sheet resistance and resistance non-uniformity.

The present invention additionally provides a method for calibrating an optical sensor used to measure annealing temperatures of titanium silicide. The method comprises heating a silicon substrate having a titanium layer from an initial temperature to a final temperature to create titanium silicide; measuring a resistivity factor of the titanium silicide at selected temperature intervals between the initial temperature and the final temperature; using an optical sensor to measure the temperature of the silicon substrate having a titanium layer, the optical sensor providing output data used to determine the annealing temperatures; determining a minimum annealing temperature on and after which the resistivity factor is generally constant; and using the minimum annealing temperature to calibrate the optical sensor wherein a selected output data for the optical sensor is adopted to represent the minimum annealing temperature.

DETAILED DESCRIPTION OF THE PREFERRED EMBODIMENTS

This application is substantially similar to Korean Patent Application No. 97-72470 filed on Dec. 23, 1997, the disclosure of which is incorporated herein by reference in its entirety.

Figure 1:
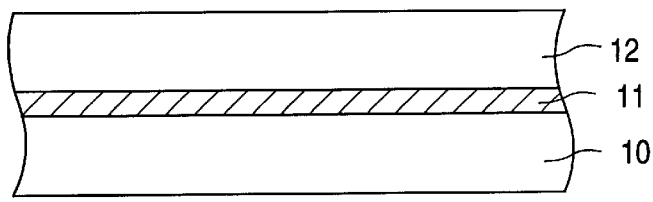
FIG. 1 is a partial cross-sectional view of a silicon substrate on which a titanium and titanium silicide layer is formed.

Preferred embodiments of the present invention will now be described in detail with reference the accompanying drawings. FIG. 1 has been simplified for ease of understanding and describing the present invention. FIG. 1 illustrates a silicon substrate or wafer 10 having a titanium film 12 formed thereon. The silicon substrate has a resistivity of, for example, 8–12 Ωcm. By way of illustration and not limitation, the titanium film 12 has a thickness of 460 Å. A titanium silicide layer 11 is formed by annealing the silicon substrate 10 by a thermal treatment, preferably rapid thermal process (RTP). RTP, as is well known and understood in the art, is rapid, high thermal treatment of the silicon substrate 10 and the titanium film 12. The high thermal treatment causes titanium (Ti) to react with silicon (Si) to form titanium silicide ($TiSi_2$). The rapidness of the process prevents impurities from significantly diffusing into the silicon substrate 10. The thermal treatment, in accordance with one aspect of the present invention, heats the silicon substrate 10 and the titanium film 12 to a selected annealing temperature. The selected annealing temperature is the minimum temperature on and after which the titanium silicide 11 displays a low and a generally constant and unchanging sheet resistivity and resistance non-uniformity, as will be described in detail below. The selected annealing temperature is preferably about 750° C. The significance of performing the thermal treatment at a temperature of at least 750° C. is described hereinafter.

Figure 2:
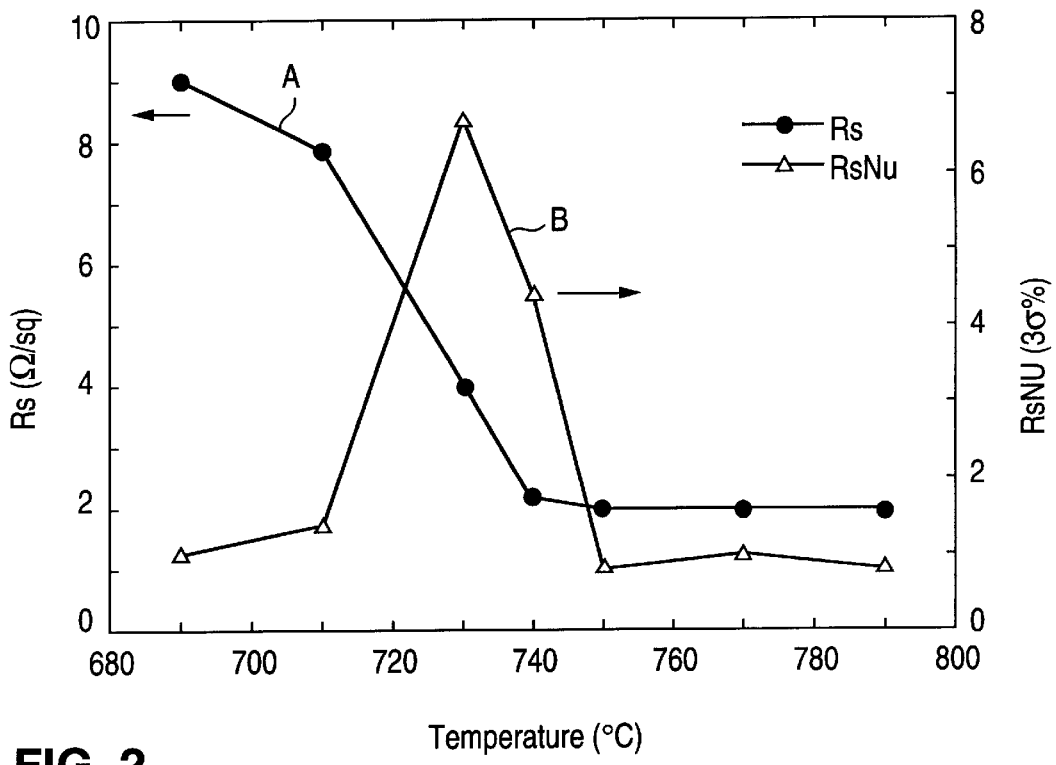
FIG. 2 is a graph illustrating sheet resistance and resistance non-uniformity versus titanium silicide annealing temperatures.

Referring to FIG. 2, curve A illustrates sheet resistance Rs (Ω/sq.) versus annealing temperature (°C.) for titanium silicide. Curve B illustrates resistance non-uniformity RsNU (3σ%) in standard deviation versus annealing temperature (°C.) for titanium silicide. Titanium silicide can be formed having a C49 phase or a C54 phase. The phase which the titanium silicide has is dictated by the annealing temperature. At approximately 700° C., the titanium silicide is in the C49 phase. The phase transition period from C49 to C54 occurs from about 720° C. to about 750° C. At and after about 750° C., the titanium silicide is in the C54 phase.

The sheet resistance Rs value of the C49 titanium silicide at approximately 700° C. is about 7.5–8 Ω/sq. In contrast, the sheet resistance Rs value of the C54 titanium silicide at approximately 750° C. is about 1.5–2 Ω/sq. Significantly, the difference in sheet resistance between the two phases is about 6 Ω/sq. C54 titanium silicide displays a much lower sheet resistance Rs. As illustrate by curve A, the sheet resistance Rs decreases rapidly during the transition phase period, i.e., between about 720° C. to about 750° C. After about 750° C., the sheet resistance Rs remains constant or unchanged.

The resistance non-uniformity RsNU increases from about 690° C. to about 730° C., where it reaches its highest value. Thereafter, the resistance non-uniformity RsNU decreases until approximately 750° C., when the titanium silicide is in the C54 phase. Resistance non-uniformity remains constant or unchanged on and after 750° C. It is preferably to form the titanium silicide at a temperature where sheet resistance Rs and resistance non-uniformity RsNU is low and generally constant. Since both the sheet resistance Rs and the resistance non-uniformity RsNU are low and generally constant on and after 750° C., it is preferable for the titanium silicide to be formed at a temperature of about 750° C. or greater.

Figure 3:
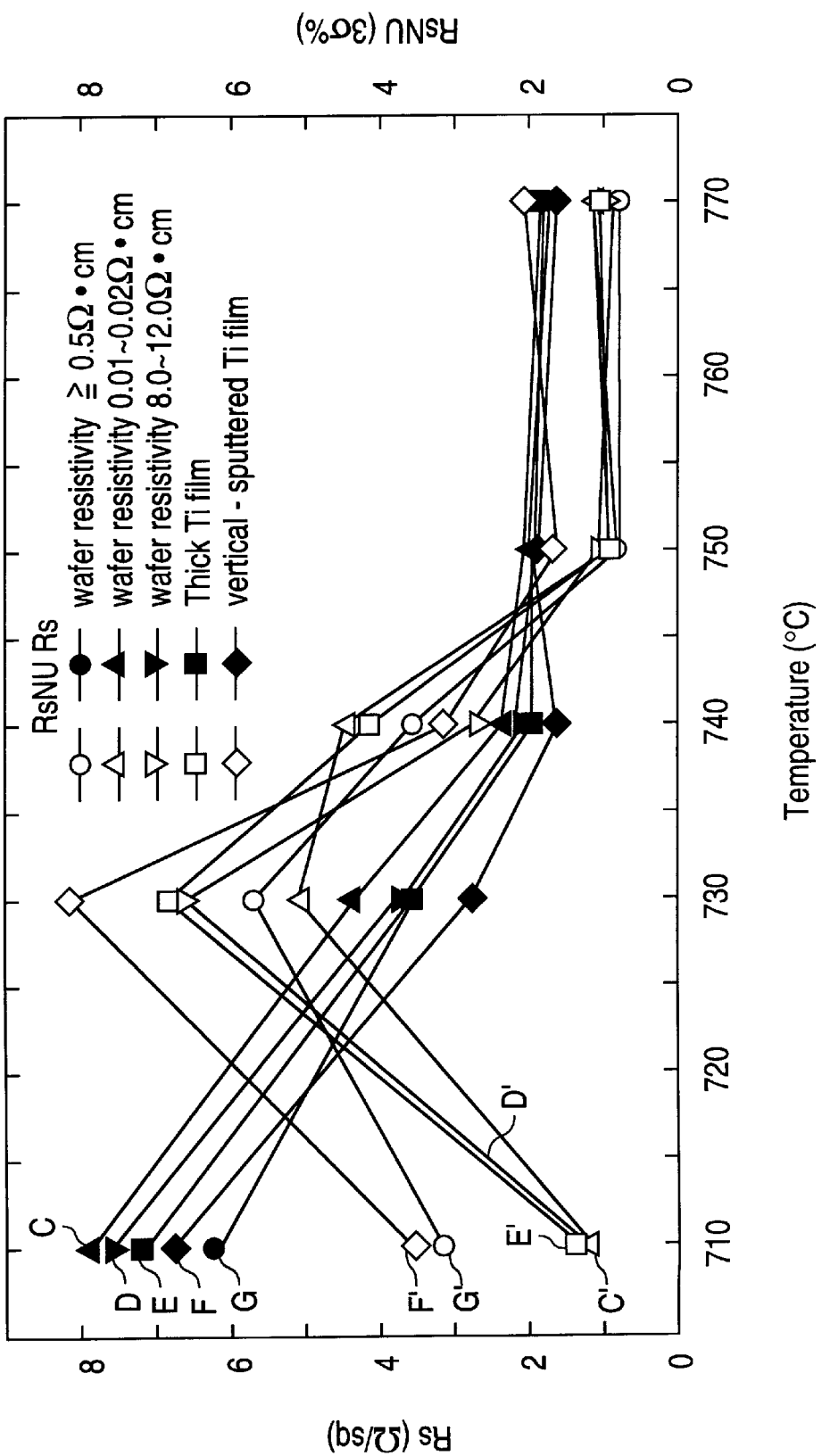
FIG. 3 is a graph illustrating sheet resistance and resistance non-uniformity versus titanium silicide annealing temperatures under various conditions.

Sheet resistance Rs and resistance non-uniformity RsNU display constant characteristic and stable values when the titanium silicide reaches the C54 phase irrespective of the thickness of the titanium layer, the method of depositing the titanium film, and the substrate type. FIG. 3 is a graph illustrating the sheet resistance Rs and resistance non-uniformity RsNU versus titanium silicide annealing temperature (°C.) under variety of conditions or parameters, such as wafer resistivity of about 0.01–0.02 Ωcm (curve C and C', respectively), wafer resistivity of about 8.0–12.0 χcm (curve D and D', respectively), a titanium film having a thickness 500 Å (curve E and E', respectively), sputtered titanium film (curve F' and F', respectively), and wafer resistivity greater than or equal to 0.5 Ωcm (curve G and G', respectively). As illustrated by curves C–G the sheet resistance Rs values are approximately equal at about 750° C. and remain generally constant or unchanged thereafter. Similarly, as illustrated by curves C'–G' the resistance non-uniformity RsNU values are approximately equal at about 750° C. and remain generally constant or unchanged thereafter. Accordingly, it is preferable to anneal the substrate for forming the titanium silicide at a temperature of at least 750° C.

In determining the minimum annealing temperature (e.g., 750° C.) at or above which an RTP is to be performed, a titanium film is deposited on a silicon substrate. The titanium film and the silicon substrate are heated from an initial temperature (e.g., initial temperature of the RTP chamber) to a final temperature (e.g., 800° C.), as is well understood in the art. As a result, the titanium and the silicon react to form titanium silicide. The resistivity factor, i.e., sheet resistance and/or resistance non-uniformity, is measured at selected temperature intervals (e.g., 1° C. intervals) between the initial temperature and the final temperature. The method of measuring sheet resistance and resistance non-uniformity is known to those skilled in the art. The temperature after which the resistivity factor is generally constant is determined. As discussed in the preceding paragraphs, the temperature after which the resistivity factor (i.e., sheet resistance and resistance non-uniformity) is generally constant and has a low value is typically about 750° C.

Figure 4:
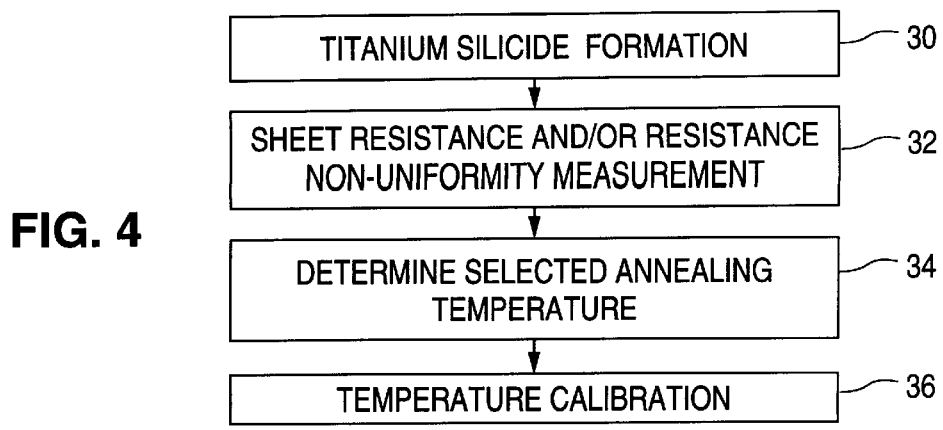
FIG. 4 is a flowchart of temperature calibration steps according to the present invention.

During the thermal treatment (e.g., RTP), the annealing temperature of the titanium silicide is measured by an optical sensor such as an optical pyrometer, as is well understood in the art. The optical sensor provides output data indicative of the temperature of the silicon substrate having the titanium or titanium/titanium silicide formed thereon. In order to be able to accurately measure the temperature, the optical sensor must be precisely calibrated. Referring to FIG. 4, step 30 indicates heating a silicon substrate from an initial temperature (e.g., initial temperature of the RTP chamber) to a final temperature (e.g., 800° C.). As a result, the titanium and the silicon react to form titanium silicide. At step 32 the resistivity factor, i.e., sheet resistance and/or resistance non-uniformity, is measured at selected temperature intervals (e.g., 1° C. intervals) between the initial temperature and the final temperature. At step 34 the minimum annealing temperature (e.g., 750° C.) after which the resistivity factor is generally constant is determined. At step 36, this minimum annealing temperature is used to calibrate the optical sensor. A selected output data for the optical sensor can be adopted to represent the minimum annealing temperature (e.g., 750° C.).

While the particular embodiments of the present invention have been shown and described, it will be obvious to those skilled in the art that changes and modifications can be made without departing from this invention in its broadest aspects, and therefore, the appended claims are to encompass within their scope all such changes and modifications as fall within the true spirit and scope of this invention.

What is claimed is:

1. A method for calibrating an optical sensor used to measure annealing temperatures of titanium silicide, comprising:

heating a silicon substrate having a titanium layer from an initial temperature to a final temperature to create titanium silicide;

measuring a resistivity factor of the titanium silicide at selected temperature intervals between the initial temperature and the final temperature;

using an optical sensor to measure the temperature of the silicon substrate having a titanium layer, the optical sensor providing output data used to determine the annealing temperature of titanium silicide;

determining a minimum annealing temperature on and after which the resistivity factor is generally constant; and using the minimum annealing temperature to calibrate the optical sensor wherein a selected output data for the optical sensor is adopted to represent the minimum annealing temperature.

2. The method of claim 1 wherein the optical sensor is an optical pyrometer.

3. The method of claim 1 wherein the resistivity factor is sheet resistance value for the titanium silicide.

4. The method of claim 1 wherein the resistivity factor is resistance non-uniformity value for the titanium silicide.

5. The method of claim 1 wherein the minimum annealing temperature is 750° C.

6. A method of calibrating an optical sensor used to measure an annealing temperature of a titanium silicide layer formed during a thermal process, wherein there is a minimum annealing temperature on and after which a resistivity factor of the titanium silicide is generally constant, the method comprising:

heating a silicon substrate having a titanium layer thereon to form the titanium silicide layer;

using an optical sensor to measure the temperature of the silicon substrate having the titanium layer;

using the minimum annealing temperature to calibrate the optical sensor wherein a selected output data for the optical sensor is adopted to represent the minimum annealing temperature.

7. The method of claim 6 wherein the optical sensor is an optical pyrometer.

8. The method of claim 6 wherein the minimum annealing temperature is 750° C.

* * * * *